United States Patent
Shi et al.

(10) Patent No.: US 9,299,669 B2
(45) Date of Patent: Mar. 29, 2016

(54) ELECTROSTATIC DISCHARGE DEVICE GATE BIASING FOR A TRANSMITTER

(71) Applicant: Amlogic Co., Ltd., Santa Clara, CA (US)

(72) Inventors: Chao Shi, San Jose, CA (US); Chieh-Yuan Chao, Fremont, CA (US)

(73) Assignee: Amlogic Co., Ltd., Santa Clara, CA (US)

( * ) Notice: Subject to any disclaimer, the term of this patent is extended or adjusted under 35 U.S.C. 154(b) by 42 days.

(21) Appl. No.: 14/162,710

(22) Filed: Jan. 23, 2014

(65) Prior Publication Data

US 2015/0207526 A1    Jul. 23, 2015

(51) Int. Cl.
| | |
|---|---|
| H01L 23/60 | (2006.01) |
| H02H 9/04 | (2006.01) |
| H01L 27/02 | (2006.01) |
| H05K 9/00 | (2006.01) |
| H05K 1/02 | (2006.01) |

(52) U.S. Cl.
CPC ............ *H01L 23/60* (2013.01); *H01L 27/0248* (2013.01); *H01L 27/0266* (2013.01); *H01L 27/0285* (2013.01); *H01L 27/0292* (2013.01); *H02H 9/041* (2013.01); *H02H 9/046* (2013.01); *H05K 1/0259* (2013.01); *H05K 9/0067* (2013.01)

(58) Field of Classification Search
CPC ........ H02H 9/046; H02H 9/041; H03F 1/523; H03K 19/017545; H03K 19/017581; H01L 27/0266; H01L 27/0248; H01L 27/0251; H01L 27/0259; H01L 27/0285; H01L 27/0288; H01L 27/0292; H01L 23/60; H05K 9/0067; H05K 1/0259

See application file for complete search history.

(56) References Cited

U.S. PATENT DOCUMENTS

| | | | | |
|---|---|---|---|---|
| 5,381,112 A | * | 1/1995 | Rybicki | H03F 3/45112 330/253 |
| 5,635,869 A | * | 6/1997 | Ferraiolo | G05F 3/262 327/103 |
| 8,279,566 B2 | * | 10/2012 | Whitfield | H01L 27/0248 361/56 |
| 2012/0262200 A1 | * | 10/2012 | Shin | H03K 19/017545 326/30 |
| 2014/0111250 A1 | * | 4/2014 | Li | H03K 19/017554 327/108 |

* cited by examiner

*Primary Examiner* — Chieh M Fan
*Assistant Examiner* — Michelle M Koeth
(74) *Attorney, Agent, or Firm* — Venture Pacific Law, PC

(57) ABSTRACT

A transmitter, comprises: a first branch for providing a positive output having a first set of serially-connected transistors; a second branch for providing a negative output having a second set of serially-connected transistors; and a biasing circuit, wherein the biasing circuit generates a first biasing voltage and a second biasing voltage as a function of the positive output, the negative output, and a predefined threshold voltage, and wherein the first biasing voltage, the second biasing voltage, and a differential input signal drive the first set of serially-connected transistors and the second set of serially-connected transistors.

12 Claims, 6 Drawing Sheets

ELECTROSTATIC DISCHARGE DEVICE GATE BIASING FOR A TRANSMITTER

FIELD OF INVENTION

This invention relates to methods and circuits for electrostatic discharge ("ESD") device gate biasing for a transmitter, and, in particular, to methods and circuits for protecting transistors of an HDMI driver from ESD device stress.

BACKGROUND

High-Definition Multimedia Interface ("HDMI") is a compact audio/video interface for transmitting uncompressed digital data. It is a digital alternative to consumer analog standards, such as radio frequency coaxial cable, composite video, S-Video, SCART, component video, D-Terminal, or VGA. HDMI connects digital audio/video sources (such as set-top boxes, DVD players, Blu-ray disc players, personal computers ("PCs"), video game consoles, AV receivers, tablet computers, and mobile phones) to audio/video displays, including computer monitors, video projectors, digital televisions, etc.

According to the HDMI standard, an HDMI transmitter uses a driver to transmit a signal to an HDMI receiver. The HDMI transmitter has a common mode output voltage of about 3V. The HDMI required far end termination voltage of about 3.3V can cause ESD device stress on the HDMI transmitter since circuit elements of the HDMI transmitter operate at significantly lower voltage levels, e.g., many HDMI transmitters use around 1.8V circuit elements. When a voltage of 3.3V is applied to the HDMI transmitter, then device stress and/or failure can occur to the HDMI transmitter. Therefore, there exists a desire for new methods and circuits for an HDMI transmitter that can avoid such device stress.

SUMMARY OF INVENTION

An object of this invention is to provide methods and circuits for adaptive ESD device gate biasing that can monitor an HDMI driver's output node voltage and avoid device stress.

Another object of this invention is to provide methods and circuits for channel impedance matching of HDMI channels.

Yet another object of this invention is to provide methods and circuits for an HDMI transmitter using a stacked transmitter architecture having adaptive gate biasing.

Briefly, the present invention relates to a transmitter, comprising: a first branch for providing a positive output having a first set of serially-connected transistors; a second branch for providing a negative output having a second set of serially-connected transistors; and a biasing circuit, wherein the biasing circuit generates a first biasing voltage and a second biasing voltage as a function of the positive output, the negative output, and a predefined threshold voltage, and wherein the first biasing voltage, the second biasing voltage, and a differential input signal drive the first set of serially-connected transistors and the second set of serially-connected transistors.

An advantage of this invention is that methods and circuits for adaptive ESD device gate biasing are provided that can monitor an HDMI driver's output node voltage and avoid device stress.

Another advantage of this invention is that methods and circuits for channel impedance matching of HDMI channels are provided.

Yet another advantage of this invention is that methods and circuits for an HDMI transmitter using a stacked transmitter architecture with adaptive gate biasing are provided.

DESCRIPTION OF THE DRAWINGS

The foregoing and other objects, aspects, and advantages of the invention will be better understood from the following detailed description of the preferred embodiment of the invention when taken in conjunction with the accompanying drawings in which.

DETAILED DESCRIPTION OF THE PREFERRED EMBODIMENTS

Figure 1:
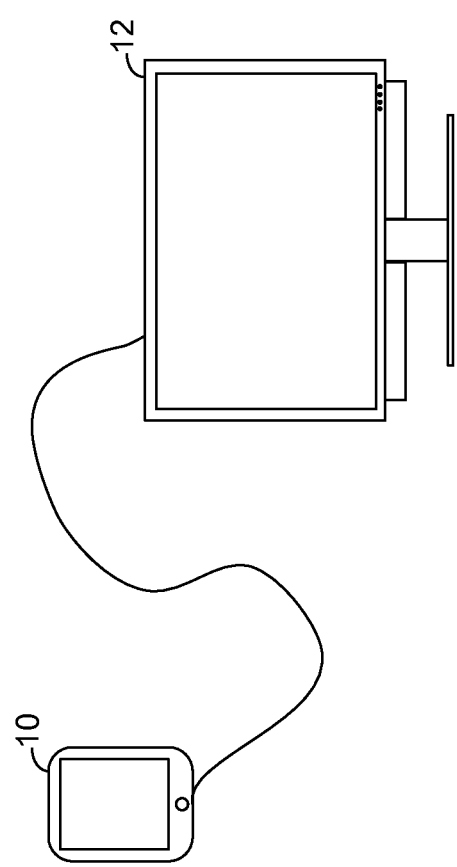
FIG. 1 illustrates a portable computing device connected to a display via an HDMI interface.

FIG. 1 illustrates a portable computing device connected to a display device via an HDMI cable. A portable computing device 10 (e.g., a tablet computer, a cellular phone, a laptop, etc.) can be used to drive a display device 12 (e.g., a computer monitor, a television, a tablet computer, projector, etc.). Various audio/video specifications (e.g., HDMI) define the protocols, signals, electrical interfaces and mechanical requirements for driving a display device using a certain one of the audio/video specifications. The portable computing device 10 can have multiple differential transmitters to drive the uncompressed video data through the physical cable to the display device 12.

For the HDMI standard, there can be around four differential transmitters that are used to transmit video data to a display using differential signals. Typically, three differential transmitters are used to transmit data and the fourth differential transmitter transmits a clock signal. The following transmitter of the present invention relates to generating a differential signal under the HDMI standard. However, it is understood by a person having ordinary skill in the art that the present invention can be applied to transmitters under other audio/video standards and interfaces. Thus, it is intended that the present invention can be applied to all of the other audio/video standards and interfaces as well.

Figure 2:
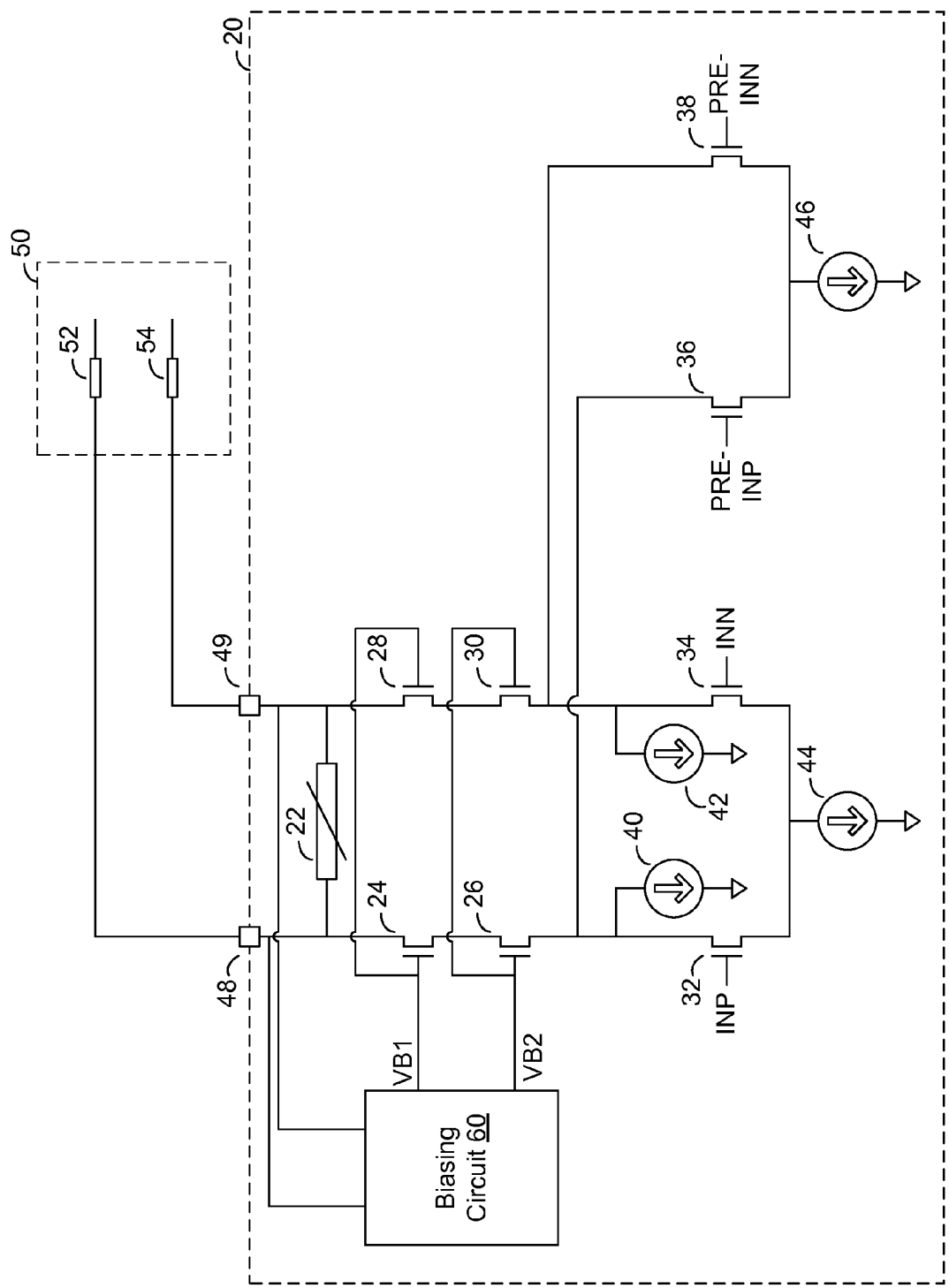
FIG. 2 illustrates an HDMI transmitter of the present invention.

FIG. 2 illustrates an HDMI transmitter of the present invention. An HDMI transmitter 20 of the present invention comprises a biasing circuit 60, a programmable resistor 22, transistors 24, 26 and 32 that are serially connected in a first branch, transistors 28, 30, and 34 that are serially connected in a second branch, current sources 40-46, and transistors 36 and 38. The output of the HDMI transmitter 20 is a differential signal with a positive output $P_{OUT}$ at node 48 and a negative output $N_{OUT}$ at node 49. A differential data signal having a positive signal INP and a negative signal INN can be inputted to the gates of the transistors 32 and 34, respectively. Furthermore, a differential pre-emphasis signal having a positive signal PRE-INP and a negative signal PRE-INN can be inputted to drive the gates of the transistors 36 and 38, respectively.

In the first branch, the transistors 24, 26 and 32 are serially connected. A first biasing voltage VB1 drives the gate of the transistor 24. A second biasing voltage VB2 drives the gate of the transistor 26. The positive signal INP drives the gate of the transistor 32. The positive output $P_{OUT}$ can be provided at one end of the first branch, e.g., at node 48. The other end of the first branch can be connected to the current source 44.

The current source 40 and the transistor 36 can be connected between the transistor 26 and the transistor 32. The current source 40 allows for a leak current to protect the transistors 24 and 26 from being stressed even when the transmitter 20 is powered down, e.g., in a sleep mode. The transistor 36 is further connected to the current source 46. The gate of the transistor 36 is driven by the pre-emphasis positive signal PRE_INP.

In the second branch, the transistors 28, 30, and 34 are serially connected. The first biasing voltage VB1 drives the gate of the transistor 28. The second biasing voltage VB2 drives the gate of the transistor 30. The negative signal INN drives the gate of the transistor 34. A negative output $N_{OUT}$ can be provided at one end of the second branch, e.g., at node 49. The other end of the second branch can be connected to the current source 44. The positive signal INP and the negative signal INN can be generated by an HDMI pre-driver (not shown).

Furthermore, the current source 44 and the transistor 38 can be connected between the transistor 30 and the transistor 34. The current source 42 allows for a leak current to protect the transistors 28 and 30 from being stressed even when the transmitter 20 is powered down, e.g., in a sleep mode. The transistor 38 is further connected to the current source 46. The gate of the transistor 38 is driven by the pre-emphasis negative signal PRE_INN. The pre-emphasis positive signal PRE_INP and the pre-emphasis negative signal PRE_INN can be generated by an HDMI pre-driver (not shown) as well.

The biasing circuit can provide the biasing voltages VB1 and VB2. The biasing voltages can be generated as a function of a common mode voltage for the transmitter and a minimal voltage level. Furthermore, the common mode voltage is a function of the output voltages $P_{OUT}$ and $N_{OUT}$. For instance, the common mode voltage can equal the average value of the output voltages $P_{OUT}$ and $N_{OUT}$. Assuming the positive output voltage $P_{OUT}$ is 3.3V and the negative output voltage $N_{OUT}$ is 2.7V, the common mode voltage can be equal to 3V, the average of the two output voltages. Thus, the biasing voltages are further a function of the output voltages $P_{OUT}$ and $N_{OUT}$. As the output voltages $P_{OUT}$ and $N_{OUT}$ fluctuate, the biasing voltages VB1 and VB2 can adaptively adjust using the methods and circuits of the present invention. The minimal voltage level provides a minimal level that the gates of the transistors 24-30 will not fall below to ensure that transistors 24-30 are not overly stressed when the transmitter 20 is in regular working mode or in sleep mode.

The programmable resistor 22 is connected across the end of the first branch with node 48 and the end of the second branch with node 49. Thus, the programmable resistor 22 is connected across the differential output voltages $P_{OUT}$ and $N_{OUT}$. The programmable resistor 22 is programmed to match the equivalent resistance of the cable 50 to an HDMI receiver. The equivalent resistance can be represented by impedance blocks 52 and 54.

The cable 50 can be used to connect the transmitter 20 to the HDMI receiver. The transmitter 20 can be embedded within a computing device or multimedia device for driving a display. The display can have the receiver for receiving the video data from the transmitter 20.

Figure 3:
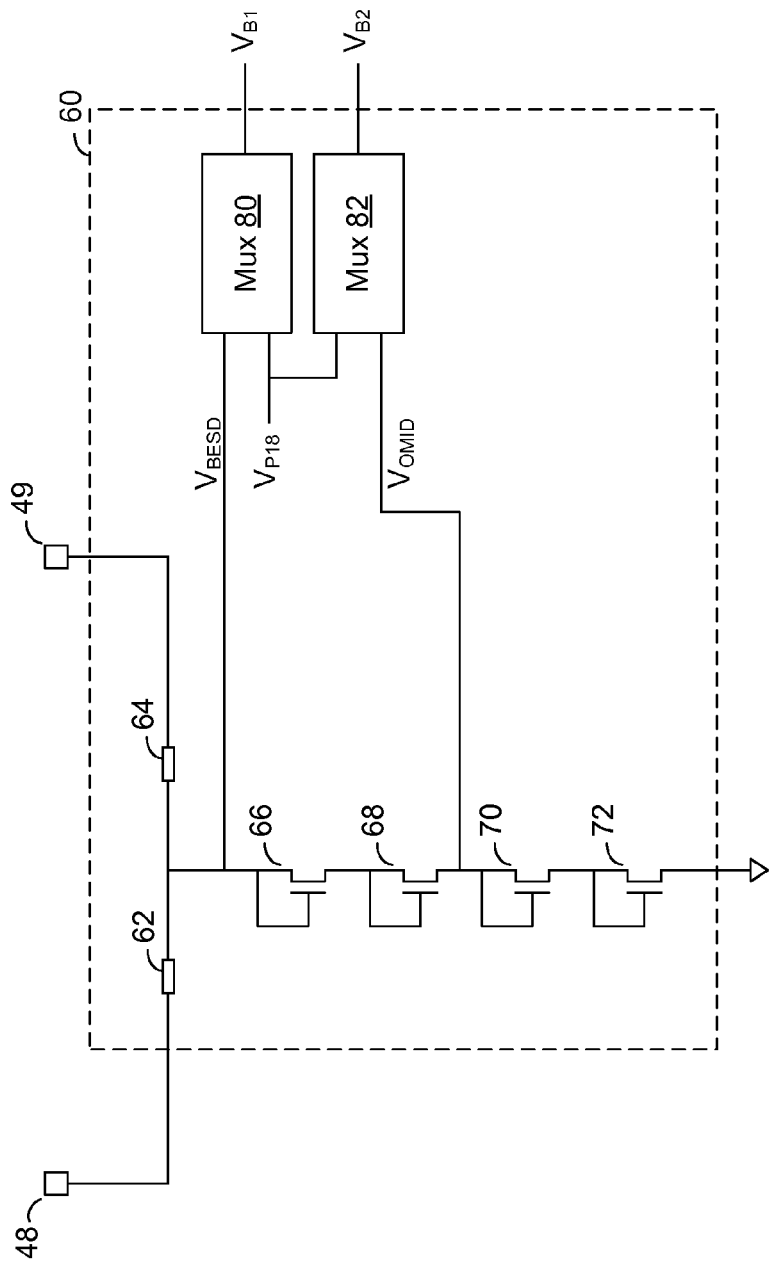
FIG. 3 illustrates a bias generation circuit of the present invention.

FIG. 3 illustrates a bias generation circuit of the present invention for biasing an HDMI transmitter. The bias generation circuit 60 of the present invention can generate the first biasing voltage VB1 and the second biasing voltage VB2 based upon the output voltages $P_{OUT}$ and $N_{OUT}$. The bias generation circuit 60 comprises resistors 62 and 64, transistors 66-72, and multiplexers 80 and 82. The resistors 62 and 64 are serially connected across the differential output voltages $P_{OUT}$ and $N_{OUT}$ at nodes 48 and 49. The transistors 66-72 are serially connected. The transistors' 66-72 gates are further connected to their respective sources.

The transistor 66 gate-source connection is also connected to the resistors 62 and 64, providing a first reference voltage $V_{BESD}$. The first reference voltage $V_{BESD}$ and a predefined threshold voltage $V_{P18}$ can be inputted to the multiplexer 80. The multiplexer 80 selects the greater voltage of the first reference voltage $V_{BESD}$ and the threshold voltage $V_{P18}$ to output as the first biasing voltage $V_{B1}$. The threshold voltage VP18 can be the power supply voltage of the transmitter 20. For instance, many transmitters have a power supply voltage of around 1.8V. However, other voltages can be used depending on the respective power supply of the transmitter.

The serial connection between the transistors 68 and 70 can provide a second reference voltage $V_{OMID}$. The second reference voltage $V_{OMID}$ and the threshold voltage $V_{P18}$ can be inputted to the multiplexer 82. The multiplexer 82 selects the greater voltage of the second reference voltage $V_{OMID}$ and the threshold voltage $V_{P18}$ to output as the second biasing voltage $V_{B2}$.

Using the biasing circuit 60, the biasing voltages VB1 and VB2 can be adaptively adjusted as the output voltages $P_{OUT}$ and $N_{OUT}$ change. Thus, the output voltages can be fed back to the biasing circuit 60 to generate the biasing voltages VB1 and Vb2 for the transmitter 20.

Figure 4:
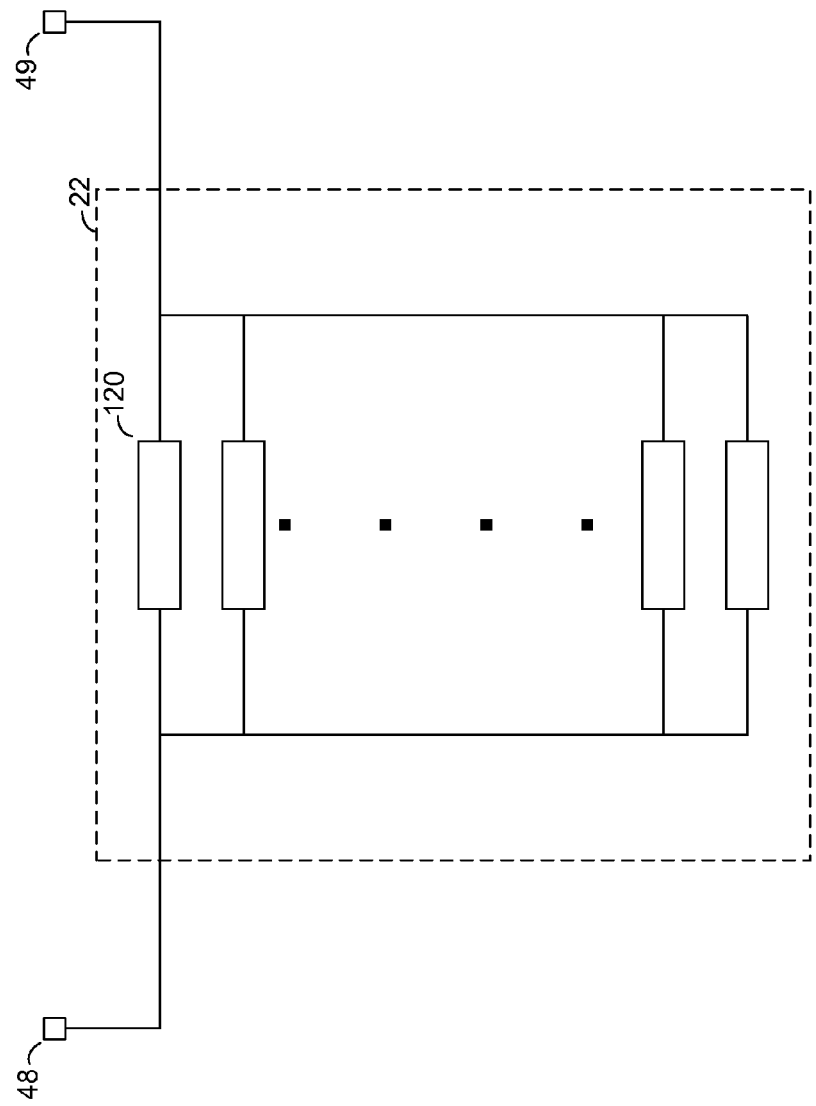
FIG. 4 illustrates a programmable resistor of the present invention.

FIG. 4 illustrates a programmable resistor of the present invention connected in parallel. The programmable resistor 22 comprises resistor modules 120 connected in parallel across the differential output voltages $P_{OUT}$ and $N_{OUT}$. The resistor modules 120 can be individually activated or deactivated to provide a variable overall resistance for the programmable resistor 22. The resistance of the programmable resistor 22 can be selected to match the impedance of the cable used to connect to the HDMI receiver. This matching can reduce inter-symbol-interference ("ISI") effect for a respective channel.

In an embodiment of the present invention, a four-bit control signal can be used to activate and deactivate resistor modules 120 connected in parallel. The number of resistor modules 120 to be activated can be dependent on the amount of resistance needed for the programmable resistor 22. Generally, the total resistance of the resistor modules 120 should be equal to about the impedance of the cable used to connect the HDMI transmitter to the HDMI receiver.

Figure 5:
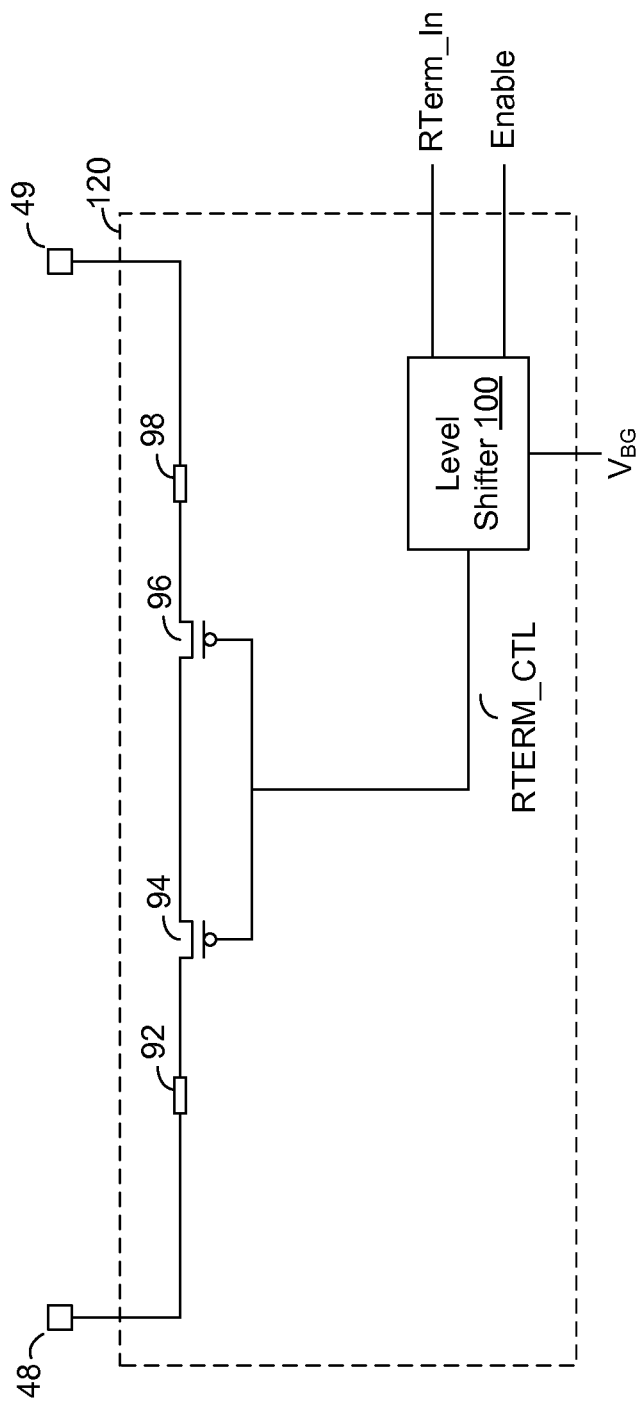
FIG. 5 illustrates a programmable resistor unit circuit of the present invention.

FIG. 5 illustrates a resistor module of the present invention. A resistor module 120 of the present invention can comprise resistors 92 and 98, transistors 94 and 96, and a level shifter 100. The resistors 92 and 98 and PMOS transistors 94 and 96 are serially connected across the differential output signals $P_{OUT}$ and $N_{OUT}$ at nodes 48 and 49. The gates of the PMOS transistors 94 and 96 are driven by the level shifter 100. The level shifter 100 receives input signals RTerm_In, Enable, and $V_{BG}$.

Generally, the input signal RTerm_In can be a voltage level near the common mode voltage $V_{BESD}$ that is internally provided by the bias generation circuit 60. The Enable signal is generated by a controller (not shown) depending on whether the resistance from the resistor module 122 is necessary or not. The controller can transform an N-bit control word to multiple enable signals to enable and/or disable certain ones of resistor modules of the respective programmable resistor.

The $V_{BG}$ is the band gap voltage. The band gap voltage $V_{BG}$ can be a predefined voltage such that the gates of the PMOS transistors 94 and 96 never fall below to reduce device stress on the PMOS transistors 94 and 96.

In an example, the band gap voltage $V_{BG}$ can be around 1.2V, which can be the turn on voltage to reduce device stress. Typically, a turn on voltage for a PMOS transistor can be about 0V. However, since there can be a common mode voltage at nodes 48 and 49 of about 3V, this may overstress the PMOS transistors 94 and 96, which may be 1.8V devices.

The level shifter 100 determines whether the Enable signal is activated. If the Enable signal is activated, then the level shifter 100 outputs the $V_{BG}$ signal to turn on the termination resistor switches 94 and 96. If the Enable signal is deactivated, then the level shifter 100 outputs the common mode voltage of output P and output N (i.e., at nodes 48 and 49 respectively) that can fully turn off the termination resistor switches 94 and 96.

Figure 6:
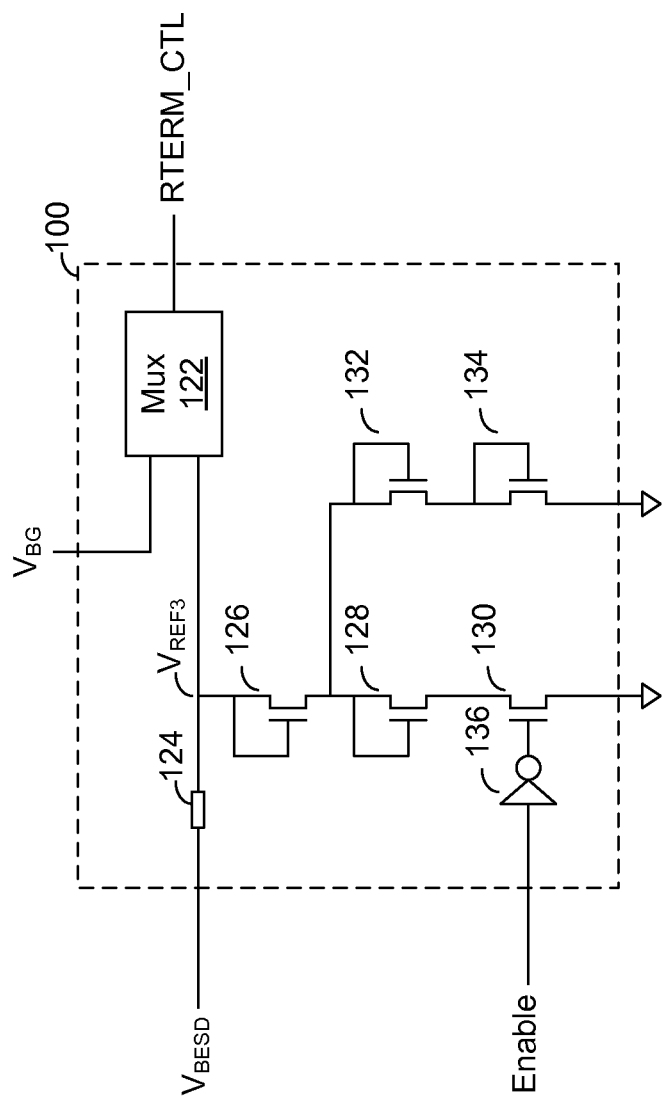
FIG. 6 illustrates a level shifter of the present invention.

FIG. 6 illustrates a level shifter of the present invention. The level shifter 100 of the present invention comprises a multiplexer 122, a resistor 124, transistors 126-134, and an inverter 136. The common mode voltage $V_{BESD}$ is connected to an end of the resistor 124. The other end of the resistor 124 is connected to the input of the multiplexer 122 and the transistor 126; the voltage at this connection can be referred to as a third reference voltage $V_{ref3}$. The third reference voltage $V_{ref3}$ and the band gap voltage $V_{BG}$ can be inputted to the multiplexer 122. The multiplexer 122 selects the greater of the third reference voltage $V_{ref3}$ and the band gap voltage $V_{BG}$ to output as the RTERM_CTL signal.

The transistors 126, 128, 132, and 134 have their gates connected to their respective sources. Furthermore, the transistors 126-130 are serially connected. The transistors 132 and 134 are serially connected with one end connected to the connection between the transistors 126 and 128 and the other end connected to ground. The inverter 136 receives the Enable signal and inverts the Enable signal to drive the gate of the transistor 130.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

We claim:

1. A transmitter having overstress protection, comprising:
   a first branch for providing a positive output having a first set of serially-connected transistors;
   a second branch for providing a negative output having a second set of serially-connected transistors;
   a first current source;
   a second current source; and
   a biasing circuit,
   wherein the biasing circuit generates a first biasing voltage and a second biasing voltage as a function of the positive output, the negative output, and a predefined threshold voltage,
   wherein the first biasing voltage and the second biasing voltage are adjusted according to fluctuations in voltages at the positive output and the negative output,
   wherein the first biasing voltage, the second biasing voltage, and a differential input signal drive the first set of serially-connected transistors and the second set of serially-connected transistors,
   wherein the first current source is connected to the first set of serially-connected transistors to leak current from the first set of serially-connected transistors,
   wherein the second current source is connected to the second set of serially-connected transistors to leak current from the second set of serially-connected transistors,
   a programmable resistor comprising resistor modules connected in parallel,
   wherein certain ones of the resistor modules are enabled as a function of a cable impedance,
   wherein each of the resistor modules comprises a first resistor, a first transistor, a second transistor, a second resistor, and a level shifter,
   wherein the first resistor, the first transistor, the second transistor, and the second resistor of the resistor module are connected in series across the positive output and the negative output,
   wherein the level shifter drives the gates of the first transistor and the second transistor,
   wherein the level shifter outputs a control signal as a function of a common mode voltage, an enable signal, and a band gap voltage,
   wherein the level shifter comprises a third multiplexer, a third resistor, transistors, and an inverter,
   wherein the inverter receives the enable signal and drives a gate of a certain one of the transistors of the level shifter,
   wherein the third resistor is serially-connected to the transistors of the level shifter to provide a third reference voltage, and
   wherein the band gap voltage and the third reference voltage are inputted to the third multiplexer to generate the control signal.

2. The transmitter of claim 1 wherein the biasing circuit comprises a first resistor, a second resistor, a third set of serially-connected transistors, a first multiplexer, and a second multiplexer.

3. The transmitter of claim 2 wherein the first resistor and the second resistor of the biasing circuit are serially connected across the positive output and the negative output, wherein the third set of serially-connected transistors is connected to the serially-connected resistors of the biasing circuit, and wherein the common mode voltage is provided at the connection between the serially-connected resistors and the third set of serially-connected transistors.

4. The transmitter of claim 3 wherein the common mode voltage and the predefined threshold voltage are inputted to the first multiplexer, and wherein the first multiplexer selects the greater input voltage to output as the first biasing voltage.

5. The transmitter of claim 3 wherein the third set of serially-connected transistors provide a first reference voltage, wherein the first reference voltage and the predefined threshold voltage are inputted to the second multiplexer, and wherein the second multiplexer selects the greater input voltage to output as the second biasing voltage.

6. The transmitter of claim 1 wherein the programmable resistor is connected across the positive output and the negative output and wherein the programmable resistor matches the cable impedance.

7. The transmitter of claim 1 wherein when the enable signal is disabled, the level shifter outputs the common mode voltage.

8. The transmitter of claim 1 wherein when the enable signal is enabled, the level shifter outputs a second reference voltage and wherein the second reference voltage is a function of the common mode voltage.

9. A transmitter having overstress protection, comprising:
a first branch for providing a positive output having a first set of serially-connected transistors;
a second branch for providing a negative output having a second set of serially-connected transistors;
a first current source;
a second current source; and
a biasing circuit having a first resistor, a second resistor, a third set of serially-connected transistors, a first multiplexer, and a second multiplexer,
wherein the biasing circuit generates a first biasing voltage and a second biasing voltage as a function of the positive output, the negative output, and a predefined threshold voltage,
wherein the first biasing voltage and the second biasing voltage are adjusted according to fluctuations in voltages at the positive output and the negative output,
wherein the first biasing voltage, the second biasing voltage, and a differential input signal drive the first set serially-connected transistors and of the second set of serially-connected transistors,
wherein the first resistor and the second resistor of the biasing circuit are serially connected across the positive output and the negative output,
wherein the third set of serially-connected transistors is connected to the serially-connected resistors of the biasing circuit,
wherein a common mode voltage is provided at the connection between the serially-connected resistors of the biasing circuit and the third set of serially-connected transistors,
wherein the common mode voltage and the predefined threshold voltage are inputted to the first multiplexer,
wherein the first multiplexer selects the greater input voltage to output as the first biasing voltage,
wherein the third set of serially-connected transistors provide a first reference voltage,
wherein the first reference voltage and the predefined threshold voltage are inputted to the second multiplexer,
wherein the second multiplexer selects the greater input voltage to output as the second biasing voltage,
wherein a programmable resistor is connected across the positive output and the negative output,
wherein the programmable resistor matches a cable impedance,
wherein the programmable resistor comprises resistor modules connected in parallel,
wherein certain ones of the resistor modules are enabled as a function of the cable impedance,
wherein each of the resistor modules comprises a first resistor, a first transistor, a second transistor, a second resistor, and a level shifter,
wherein the first resistor, the first transistor, the second transistor, and the second resistor of the resistor module are connected in series across the positive output and the negative output,
wherein the level shifter drives the gates of the first transistor and the second transistor,
wherein the level shifter outputs a control signal as a function of the common mode voltage, an enable signal, and a band gap voltage,
wherein the level shifter comprises a third multiplexer, a third resistor, transistors, and an inverter,
wherein the inverter receives the enable signal and drives a gate of a certain one of the transistors of the level shifter,
wherein the third resistor is serially-connected to the transistors of the level shifter to provide a third reference voltage,
wherein the band gap voltage and the third reference voltage are inputted to the third multiplexer to generate the control signal,
wherein the first current source is connected to the first set of serially-connected transistors to leak current from the first set of serially-connected transistors, and
wherein the second current source is connected to the second set of serially-connected transistors to leak current from the second set of serially-connected transistors.

10. The transmitter of claim 9 wherein when the enable signal is disabled, the level shifter outputs the common mode voltage.

11. The transmitter of claim 9 wherein when the enable signal is enabled, the level shifter outputs a second reference voltage and wherein the second reference voltage is a function of the common mode voltage.

12. A transmitter, comprising:
a first branch for providing a positive output having a first set of serially-connected transistors;
a second branch for providing a negative output having a second set of serially-connected transistors;
a programmable resistor having resistor modules connected in parallel across the positive output and the negative output, wherein the programmable resistor is set to match a cable impedance, and wherein certain ones of the resistor modules are enabled as a function of the cable impedance; and
a biasing circuit having a first resistor, a second resistor, a third set of serially-connected transistors, a first multiplexer, and a second multiplexer,
wherein the biasing circuit generates a first biasing voltage and a second biasing voltage as a function of the positive output, the negative output, and a predefined threshold voltage,
wherein the first biasing voltage, the second biasing voltage, and a differential input signal drive the first set of serially-connected transistors and of the second set of serially-connected transistors,
wherein the first resistor and the second resistor of the biasing circuit are serially connected across the positive output and the negative output,
wherein the third set of serially-connected transistors is connected to the serially-connected resistors of the biasing circuit,
wherein a common mode voltage is provided at the connection between the serially-connected resistors of the biasing circuit and the third set of serially-connected transistors,
wherein the common mode voltage and the predefined threshold voltage are inputted to the first multiplexer,
wherein the first multiplexer selects the greater input voltage to output as the first biasing voltage,
wherein the third set of serially-connected transistors provide a first reference voltage,
wherein the first reference voltage and the predefined threshold voltage are inputted to the second multiplexer,
wherein the second multiplexer selects the greater input voltage to output as the second biasing voltage,
wherein each of the resistor modules comprises a first resistor, a first transistor, a second transistor, a second resistor, and a level shifter, wherein the first resistor, the first transistor, the second transistor, and the second resistor of the resistor module are connected in series across the positive output and the negative output, wherein the level shifter drives the gates of the first transistor and the second transistor, wherein the level shifter outputs a control signal as a function of the common mode voltage, an enable signal, and a band gap voltage, wherein when the enable signal is disabled, the level shifter outputs the common mode voltage, wherein when the enable signal is enabled, the level shifter outputs a second reference voltage, wherein the second reference voltage is a function of the common mode voltage, wherein the level shifter comprises a third multiplexer, a third resistor, transistors, and an inverter, wherein the inverter receives the enable signal and drives a gate of a certain one of the transistors of the level shifter, wherein the third resistor is serially-connected to the transistors of the level shifter to provide a third reference voltage, and wherein the band gap voltage and the third reference voltage are inputted to the third multiplexer to generate the control signal.

* * * * *